US009540858B2

United States Patent
Wuerstlein et al.

(10) Patent No.: US 9,540,858 B2
(45) Date of Patent: Jan. 10, 2017

(54) ANTI-TRAP PROTECTION METHOD AND DEVICE FOR AN ADJUSTABLE VEHICLE PART

(71) Applicant: BROSE FAHRZEUGTEILE GMBH & CO. KOMMANDITGESELLSCHAFT, HALLSTADT, Hallstadt (DE)

(72) Inventors: Holger Wuerstlein, Zeil Am Main (DE); Christian Herrmann, Leipzig (DE); Florian Pohl, Ebersdorf (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 0 days.

(21) Appl. No.: 14/860,934

(22) Filed: Sep. 22, 2015

(65) Prior Publication Data

US 2016/0010381 A1  Jan. 14, 2016

Related U.S. Application Data

(63) Continuation of application No. PCT/EP2014/055721, filed on Mar. 21, 2014.

(30) Foreign Application Priority Data

Mar. 22, 2013  (DE) .......................... 10 2013 005 063

(51) Int. Cl.
  *E05F 15/42*  (2015.01)
  *E05F 15/46*  (2015.01)
  *H03K 17/955*  (2006.01)

(52) U.S. Cl.
  CPC .............. *E05F 15/42* (2015.01); *E05F 15/46* (2015.01); *E05Y 2400/54* (2013.01);
  (Continued)

(58) Field of Classification Search
  CPC ....... E05F 15/41; E05F 15/46; E05Y 2900/50; E05Y 2400/54; H03K 2217/960775; H03K 17/955
  (Continued)

(56) References Cited

U.S. PATENT DOCUMENTS

| 2004/0172879 A1* | 9/2004 | Regnet ...................... B60J 10/00 49/26 |
| 2009/0146827 A1 | 6/2009 | Wuerstlein et al. |
| 2011/0163764 A1* | 7/2011 | Shank .................... B60N 2/002 324/658 |

FOREIGN PATENT DOCUMENTS

| DE | 4416803 A1 | 11/1994 |
| DE | 102005054171 A1 | 5/2007 |

(Continued)

*Primary Examiner* — Anne M Antonucci
(74) *Attorney, Agent, or Firm* — Laurence A. Greenberg; Werner H. Stemer; Ralph E. Locher

(57) ABSTRACT

In the course of an easily implemented anti-trap protection method for an adjustable vehicle part, a test variable is continuously determined by way of a distance sensor during the adjustment of the vehicle part. A direct anti-trap protection test determines, based on the test variable, whether an obstacle is detectable in the adjustment path of the vehicle part. The adjustment is stopped or reversed if necessary. An indirect anti-trap protection test determines on the basis of the same test variable whether the movement of the vehicle part has slowed down irregularly or come to a stop, and the adjustment is stopped or reversed if necessary. An associated anti-trap protection device includes an anti-trap protection control unit, which is designed for automatically performing the method.

8 Claims, 2 Drawing Sheets

(52) U.S. Cl.
CPC ....... *E05Y 2900/50* (2013.01); *E05Y 2900/55* (2013.01); *H03K 17/955* (2013.01); *H03K 2217/960775* (2013.01)

(58) Field of Classification Search
USPC .......................................................... 701/49
See application file for complete search history.

(56) References Cited

FOREIGN PATENT DOCUMENTS

| | | |
|---|---|---|
| DE | 102007014451 A1 | 12/2007 |
| DE | 102006029685 A1 | 1/2008 |
| EP | 2066034 A2 | 6/2009 |
| WO | 2007054363 A2 | 5/2007 |

\* cited by examiner

ANTI-TRAP PROTECTION METHOD AND DEVICE FOR AN ADJUSTABLE VEHICLE PART

CROSS-REFERENCE TO RELATED APPLICATION

This application is a continuation, under 35 U.S.C. §120, of copending international application No. PCT/EP2014/055721, filed Mar. 21, 2014, which designated the United States; this application also claims the priority, under 35 U.S.C. §119, of German patent application DE 10 2013 005 063.4, filed Mar. 22, 2013; the prior applications are herewith incorporated by reference in their entirety.

BACKGROUND OF THE INVENTION

Field of the Invention

The present invention relates to an anti-trap protection method for an adjustable vehicle part and an associated anti-trap protection device.

For safety reasons, an anti-trap protection device is required for motor-driven adjusting devices for vehicle parts which are adjustable with respect to a fixed frame, in order to stop the motor operation, and reverse it if necessary, in a trapping situation in which an object or a body part is trapped while adjusting the vehicle part. In this case, the adjustable vehicle part is, for example, a vehicle window, a vehicle seat, a sliding door, a tailgate, etc. The body of the motor vehicle generally forms the fixed frame interacting with the adjustable vehicle part.

Customarily, a distinction is made in anti-trap protection devices between indirect and direct anti-trap protection. An indirect anti-trap protection device detects the trapping situation based on monitoring an operating variable of the servomotor driving the vehicle part, for example, an abnormal increase of the motor current or an abnormal decrease in the motor speed. A direct anti-trap protection device generally includes one or multiple sensors which detect a measured variable that is characteristic of the presence or absence of an obstacle in the adjustment path of the vehicle part, and an evaluation unit which decides, based on this measured variable, whether an obstacle is present in the opening area, and triggers appropriate countermeasures if necessary. In order to prevent the anti-trap protection device from stopping or reversing the adjustment of the vehicle part only in the case of direct contact of the obstacle with the vehicle part, non-contact sensors are often used in a direct anti-trap protection device which already detect an obstacle at a certain distance from the sensor. Non-contact sensors include in particular so-called capacitive proximity sensors.

A capacitive proximity sensor includes one or multiple electrodes via which an electric field is established along the adjustment path of the vehicle part. An obstacle in the adjustment path is detected by monitoring the capacitance of the electrode arrangement. Thus, use is made of the fact that an obstacle, in particular a human body part, influences the electric field generated by the sensor and thereby influences the measurable capacitance of the electrode arrangement. Alternatively to capacitive proximity sensors, other sensors functioning in a non-contact manner may be used, for example, optical sensors or ultrasonic sensors.

Under certain circumstances, a direct anti-trap protection device which is equipped with non-contact sensors may not correctly detect an obstacle in the adjustment path. This is the case, for example, with an optical sensor if the obstacle is transparent to the optical wavelength. On the other hand, a capacitive proximity sensor often does not detect obstacles which do not influence or only weakly influence the electric measuring field due to electrically neutral material properties, for example, obstacles made of electrically insulating material having low permittivity (dielectric constant).

Commonly assigned German published patent application DE 44 16 803 A1 describes an anti-trap protection device which combines direct anti-trap protection and indirect anti-trap protection. There, the direct anti-trap protection is based on a capacitance measurement, whereas the indirect anti-trap protection is based on a measurement of the motor speed. The goal is thus to provide redundancy for detecting the trapping situation if the direct or the indirect anti-trap protection fails. With the aid of this anti-trap protection device, a trapping situation may also be detected if the (functioning) direct anti-trap protection does not detect the obstacle in the adjustment path.

SUMMARY OF THE INVENTION

It is accordingly an object of the invention to provide an anti-trap protection device and an associated anti-trap protection method which overcome the above-mentioned and other disadvantages of the heretofore-known devices and methods of this general type and which provide for a simplified anti-trap protection device and method without decreasing the reliability with which a trapping situation is detected.

With the foregoing and other objects in view there is provided, in accordance with the invention, an anti-trap protection method for an adjustable vehicle part, the method comprising the following steps, to be performed continuously during an adjustment of the vehicle part:

acquiring a test value with the aid of a distance sensor;

performing a direct anti-trap protection test based on the test value by ascertaining whether an obstacle is detectable in the adjustment path of the vehicle part and, if necessary, stopping or reversing the adjustment; and performing an indirect anti-trap protection test based on the same test value by ascertaining whether a motion of the vehicle part has slowed down in an irregular manner or has come to a standstill and, if necessary, stopping or reversing the adjustment.

In other words, in the anti-trap protection method according to the present invention for an adjustable vehicle part (hereinafter adjustment part), during the adjustment of the adjustment part, a test value is continuously ascertained with the aid of a distance sensor. Based on this test value, in a direct anti-trap protection test, it is initially ascertained whether an obstacle is detectable in the adjustment path of the adjustment part. If necessary, the adjustment of the adjustment part is stopped or reversed. Furthermore, according to the method, in an indirect anti-trap protection test based on the same test value, it is ascertained whether the motion of the adjustment part has slowed down in an irregular manner or has come to a standstill. If necessary, the adjustment of the adjustment part is stopped or reversed. A slowing down of the motion of the adjustment part is detected as "irregular" in particular if it occurs before reaching the final position of the adjustment path or a predefined stopping position of the ongoing adjustment operation and exceeds typical fluctuations in the adjustment speed.

The indirect anti-trap protection test is preferably carried out temporally in parallel (simultaneously) with, or having a slight time offset from, the direct anti-trap protection test.

The adjustment part is preferably a tailgate of the vehicle which is motor-driven in order to reversibly close the trunk opening. Alternatively, the adjustment part is a window, a sunroof, a vehicle seat, or a folding top of a convertible, each being motor-driven. Preferably, the anti-trap protection method is carried out during a closing motion of the adjustment part (in the case of a vehicle seat, when adjusting it downward, i.e., in the direction of the floor of the vehicle interior), since a particularly high risk of trapping exists in this situation. However, within the scope of the present invention, it is also conceivable in particular in the case of the tailgate to carry out the anti-trap protection method also during an opening motion of the tailgate. As a result, the tailgate striking an obstacle (for example, an adjacent vehicle, a parking garage wall) or trapping a person or an object on such an obstacle may be prevented in a simple manner.

The anti-trap protection method according to the present invention achieves a particularly high level of reliability with respect to the detection of a trapping situation, in other words, a particularly low risk of error, by carrying out a direct anti-trap protection test redundantly with an indirect anti-trap protection test. The direct anti-trap protection test thus makes possible a particularly early detection of a trapping situation via the direct detection of the obstacle. In particular, in many cases, the trapping situation may be already proactively detected before the adjustment part actually exerts a considerable trapping force on the obstacle. The indirect anti-trap protection test also acts as an additional safeguard in that it also ensures the detection of trapping situations which are not detected in the direct anti-trap protection test due to unfavorable properties of the trapped object.

The fact that both anti-trap protection tests are based on the evaluation of the same test value thus makes possible a considerable simplification of the implementation of the method, since only a single distance sensor is required to ascertain the test value. An additional simplification of the implementation of the method is made possible in that intermediate results of the method, in particular when calculating the test value, may be used for both anti-trap protection tests, so that these intermediate results must be calculated only one time.

In order to be able to differentiate simply and reliably between a "direct trapping situation" (i.e., an irregular profile of the test value which is caused directly by the presence of an obstacle in the adjustment path) and an "indirect trapping situation" (i.e., an irregular profile of the test value which is caused indirectly by the influence of the obstacle on the motion of the adjustment part) based on the same test value, the test value is preferably compared with a reference value which is in particular predefined as a function of time, this reference value reproducing the profile of the test value to be expected during trouble-free operation, i.e., when the trapping situation does not exist. During the course of the direct anti-trap protection test, the adjustment is stopped or reversed if the test value has a time dependence which is significantly stronger than the reference value according to stored criteria. During the course of the indirect anti-trap protection test, however, the adjustment is stopped or reversed if the test value has a time dependence which is significantly weaker than the reference value according to stored criteria. Preferably, threshold value comparisons, which are described in greater detail below, are used as criteria for the comparison of the time dependence of the test value with the time dependence of the reference value. Within the scope of the present invention, it is also conceivable that the reference value is predefined in a path-dependent manner. In this case, the path dependence of the reference value for carrying out the direct and indirect anti-trap protection tests is converted into a time dependence.

The method variant described above is based on the discovery that on the one hand, an indirect trapping situation always results in a reduction of the time dependence of the signals output by a distance sensor (and thus the test value derived from it), particularly as the ambient conditions of the distance sensor also always change more slowly with the trapping situation-dependent slowing down of the adjustment part.

On the other hand, an obstacle situated in the adjustment path of the adjustment part always forms the nearest object which is detectable by the distance sensor. Therefore, if the obstacle is directly detectable by the distance sensor, the introduction of the obstacle into the adjustment path must, as is known, always result in a greater time dependence of the test value than would be expected in the trouble-free case, particularly as the distance measured by the distance sensor is necessarily shortened by the obstacle.

Within the scope of the present invention, the relationship of the test value to the signal of the distance sensor may generally be defined in many different ways. Preferably, the signal of the distance sensor is used unchanged as the test value. However, within the scope of the present invention, it is also conceivable to derive the test value from the signal of the distance sensor according to a linear or non-linear relationship. For example, within the scope of the present invention, the test value could have a logarithmic, exponential, or polynomial (i.e., quadratic, cubic, etc.) relationship to the signal of the distance sensor.

The test value is preferably correlated running in the same direction or in the opposite direction to the distance measured by the distance sensor. "Correlation running the same direction" refers to a relationship of the test value to the measured distance in which the test value changes in the same direction as the distance, in which the test value thus becomes larger with increasing distance and smaller with decreasing distance. On the other hand, "correlation running in the opposite direction" refers to a relationship of the test value to the measured distance in which the test value changes in the opposite direction to the distance, in which the test value thus becomes smaller with increasing distance and larger with decreasing distance.

Alternatively to this, within the scope of the present invention, the test value may also be correlated running in the same direction or in the opposite direction to the temporal change, in particular a time-delayed (moving-averaged) derivative of the distance measured by the distance sensor. "Correlation running in the same direction and in the opposite direction" refers to a change of the test value running in the same direction or the opposite direction to the change in distance.

In any case, the reference value is adapted to each definition of the test value in such a way that it corresponds to the profile of the test value to be expected in trouble-free operation.

In one preferred embodiment of the method, the reference value is defined in such a way that it has a magnitude which decreases over time. In this case, in the direct anti-trap protection test, the adjustment is stopped or reversed if the test value falls below the reference value by a first threshold value. On the other hand, in the indirect anti-trap protection test, the adjustment is stopped or reversed if the test value exceeds the reference value by a second threshold value.

Alternatively to this, the reference value is defined in such a way that it has a magnitude which increases over time. In this case, in the direct anti-trap protection test, the adjustment is stopped or reversed if the test value exceeds the reference value by a first threshold value. On the other hand, in the indirect anti-trap protection test, the adjustment is stopped or reversed if the test value falls below the reference value by a second threshold value.

The first threshold value and the second threshold value may in both cases be set independently of each other to equal or different values.

Within the scope of the present invention, the reference value may be ascertained once in test runs of the adjustment of the adjustment part and unchangeably stored in a memory module for carrying out the anti-trap protection method. Preferably, however, the reference value is continuously taught-in during trouble-free operation and is thus updated with variable ambient conditions if necessary. As a result of this teach-in process, it is, for example, possible to take into account influences which variably influence the adjustment motion over the service life of the adjustment part, for example, temperature and aging of the adjustment mechanism.

Here and below, "anti-trap protection device" generally refers to a device for carrying out an anti-trap protection method. The anti-trap protection device according to the present invention includes an anti-trap protection control unit (hereinafter control unit), which is configured in terms of circuitry or programming to automatically carry out the anti-trap protection method according to the present invention, in particular in one of the specific embodiments described above.

Within the scope of the present invention, the control unit may be designed as a non-programmable electronic circuit and, for example, may be integrated into a controller of a servomotor driving the vehicle part. However, within the scope of the present invention, the control unit may also be formed by a microcontroller in which the functionality for carrying out the anti-trap protection method according to the present invention is implemented in the form of a software module. This software module may in particular form an integral part of a comprehensive control software program (firmware) of the controller of the servomotor.

In one preferred embodiment, the distance sensor is a capacitive proximity sensor. This proximity sensor preferably includes an electrode arrangement including at least one transmitting electrode and one receiving electrode which are preferably situated next to each other on the adjustment part or opposite to it on the vehicle frame along the adjustment path. The electrode arrangement is in particular situated on the adjustment part (the vehicle frame) in such a way that an electric measuring field is emitted from it in the direction of the adjustment path to be covered. The approach of a capacitively conductive and grounded object (for example, a body part) into the electric measuring field results in a reduction of the capacitance measured between the two electrodes.

Alternatively, within the scope of the present invention, it is also conceivable to arrange the, or each, transmitting electrode and the, or each, receiving electrode in juxtaposition on the vehicle frame and the adjustment part. Furthermore, within the scope of the present invention, the electrode arrangement of the distance sensor may also include only one electrode or multiple electrodes of the same type, with the aid of which the capacitance to ground, for example, the grounded vehicle frame, is measured.

Other features which are considered as characteristic for the invention are set forth in the appended claims.

Although the invention is illustrated and described herein as embodied in anti-trap protection for an adjustable vehicle part, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
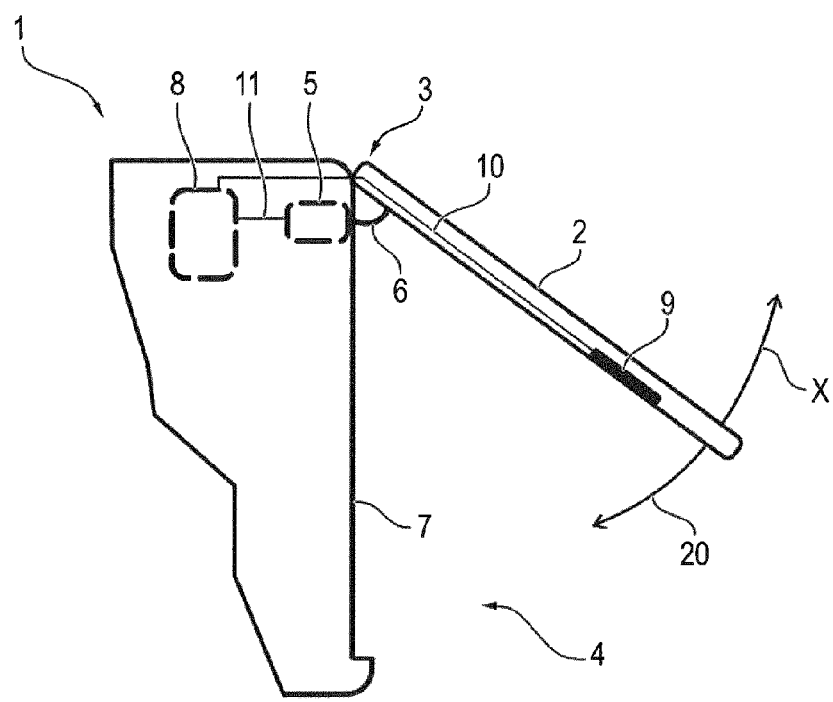
FIG. 1 shows a schematic side view of the rear of a vehicle including an adjustable vehicle part which is equipped with an anti-trap protection device.

Referring now to the figures of the drawing in detail and first, particularly, to FIG. 1 thereof, there is shown a schematic illustration of the rear 1 of a motor vehicle. A tailgate 2 is pivotally hinged on an upper edge 3 on the rear 1. The tailgate 2 is an adjustable vehicle part which is provided for reversibly closing a trunk opening 4 situated in the area of the rear 1. For this purpose, the tailgate 2 is pivotable between a closed position and an open position along an adjustment path X which approximately describes a quarter circle.

The tailgate 2 is motor-driven for adjustment by an adjustment unit 5. For this purpose, the adjustment unit 5 includes, in a manner not shown in detail, an electric motor and a gear which is subordinate to the electric motor, with the aid of which an adjusting force is transmitted to the tailgate 2 via a lever arm 6.

In order to prevent an obstacle, for example, a body part of a person or another object, from being trapped between the tailgate 2 and the vehicle frame 7 bordering the trunk opening 4 when closing the tailgate 2, i.e., when moving from the open position to the closed position, an anti-trap protection device is associated with the adjustment unit 5. The anti-trap protection device includes an anti-trap protection control unit (hereinafter control unit 8) and a capacitive distance sensor 9. The distance sensor 9 is connected to the control unit 8 using signal transmission technology via a sensor line 10.

When closing the tailgate 2, the control unit 8 is configured to detect an obstacle between the tailgate 2 and the vehicle frame 7 by carrying out an anti-trap protection method which is described in greater detail below, and to stop or reverse the motor of the adjustment unit 5 if necessary. For this purpose, the control unit 8 is connected to the adjustment unit 5 via a control line 11.

Figure 2:
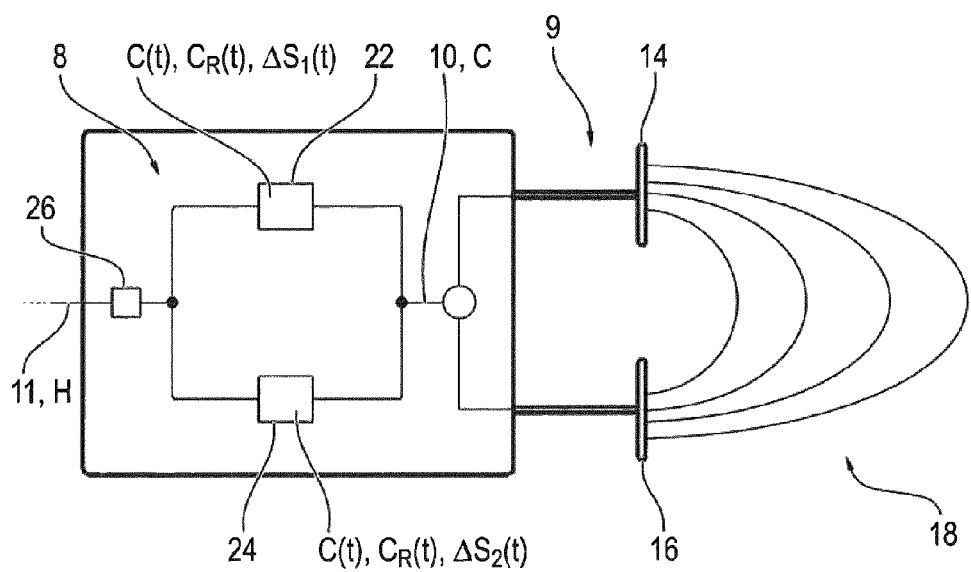
FIG. 2 shows a schematic block diagram of the anti-trap protection device.

FIG. 2 schematically depicts the anti-trap protection device in greater detail. For measuring the distance between the tailgate 2 and the vehicle frame 7, or the obstacle which may possibly present, the capacitive distance sensor 9 includes a transmitting electrode 14 and a receiving electrode 16 which are situated next to each other on the tailgate 2. By applying a voltage, an alternating electric field (i.e., an electric field in which the field strength periodically changes signs), referred to as a measuring field 18, is established between the transmitting electrode 14 and the receiving electrode 16. The transmitting electrode 14 and the receiving electrode 16 are situated on the tailgate 2 in such a way that the measuring field 18 is emitted in the closing direction 20 of the adjustment path X, i.e., in the direction of the vehicle frame 7. The transmitting electrode 14 and the receiving electrode 16 thus form an electric capacitor having a capacitance C. The capacitance C is detected by the distance sensor 9 and fed to the control unit 8 via the sensor line 10.

Figure 3:
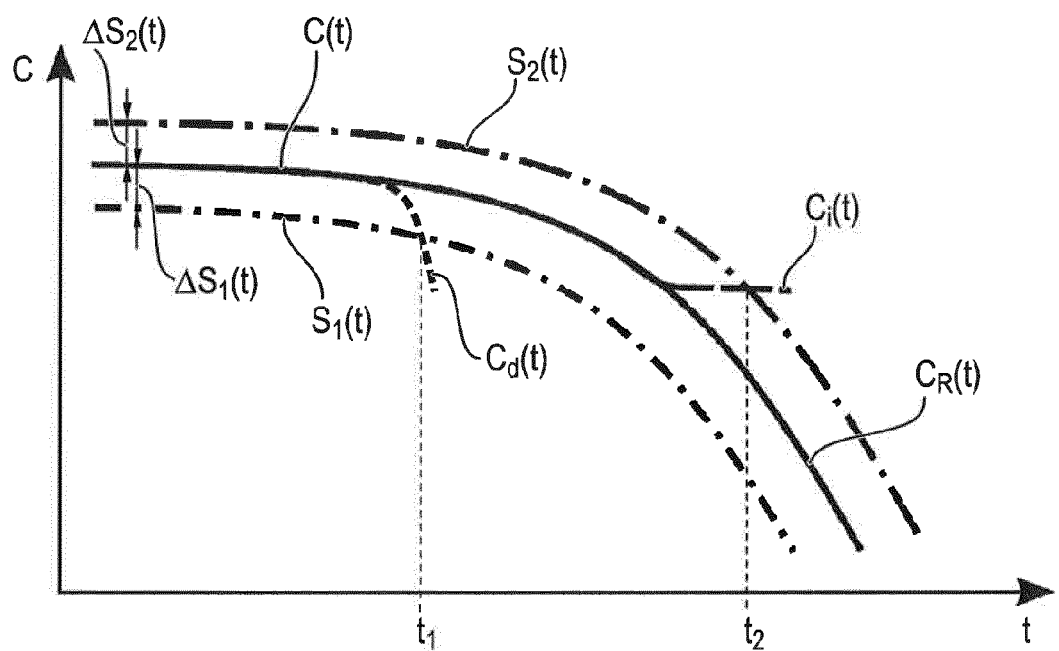
FIG. 3 shows a schematic diagram of a typical profile of a test value ascertained by the anti-trap protection device and two threshold values for the indirect and direct detection of a trapping situation.

If electrically conductive and grounded material reaches the range of the measuring field 18, the measuring field 18 interacts with this material, whereby the capacitance C of the distance sensor 9 is reduced (see FIG. 3). In the alternating field emitted by the distance sensor 9, both the vehicle frame 7 and the human body act as an electrically conductive and grounded material. On the other hand, electrically insulating material having low permittivity, for example, dry wood, interacts only weakly with the measuring field 18. An obstacle which is made up of such a material is thus "invisible" to the distance sensor 9 and is thus not directly detectable.

In order nonetheless to be able to prevent such an obstacle which is "invisible" to the capacitive distance sensor 9 from being trapped between the tailgate 2 and the vehicle frame 7, the temporal profile of the capacitance C (capacitance profile C(t)) is checked by the control unit 8 as a test value for a direct trapping situation in a direct anti-trap protection test 22 and for an indirect trapping situation in an indirect anti-trap protection test 24.

A "direct trapping situation" exists if an obstacle which is situated in the adjustment path X between the tailgate 2 and the vehicle frame 7 is directly detected by the control unit 8, without direct contact with the tailgate 2. In contrast, an "indirect trapping situation" exists if an obstacle which is "invisible" to the distance sensor 9 is trapped between the tailgate 2 and the vehicle frame 7 and is only indirectly detected by the control unit 8 based on the resulting irregularly stopping tailgate motion.

When detecting a direct trapping situation as well as when detecting an indirect trapping situation, a stop signal H is output to the adjustment unit 5 via a triggering unit 26 of the control unit 8, on the basis of which the adjustment motion is stopped or reversed.

Referring now to FIG. 3, we shall describe an anti-trap protection method carried out by the control unit 8 in greater detail based on a diagram in which the profile of the capacitance C is plotted over time t. During trouble-free operation, i.e., when a trapping situation does not exist, the measured capacitance profile C(t) corresponds to a reference profile $C_R(t)$ of a reference value $C_R$, which is plotted by a solid line in FIG. 3. The reference profile $C_R(t)$ is taught in by the control unit 8 during the ongoing trouble-free operation of the adjustment unit 5, the reference value $C_R$ preferably being averaged over multiple previous adjustment operations. In order to achieve a repeatability of the adjustment operations which is as high as possible, the adjustment motion of the tailgate 2 is preferably regulated to a predefined speed profile via a control device of the adjustment unit 5.

The reference value $C_R$ thus describes the value to be expected of the time-dependent capacitance C. The reference profile $C_R(t)$ thus specifically describes the decrease in capacitance C to be expected in a typical trouble-free closing operation of the tailgate 2, which is based on the approach of the tailgate 2 to the conductive and grounded vehicle frame 7.

An abrupt drop in the measured capacitance C is caused by an obstacle made of electrically conductive, grounded material, in particular by a human body, introduced between the tailgate 2 and the vehicle frame 7, as is depicted by way of example in FIG. 3 as a capacitance profile $C_d(t)$. As a result, the capacitance profile $C_d(t)$ of the measured capacitance C decreases earlier or more steeply than the reference profile $C_R(t)$. The time dependence of the measured capacitance profile $C_d(t)$, which is thus stronger compared to the reference profile $C_R(t)$, is detected by the control unit 8 in the direct anti-trap protection test 22 in that the measured capacitance profile $C_d(t)$ falls below the reference profile $C_R(t)$ by a predefined threshold value $\Delta S_1(t)$.

In the case of an indirect trapping situation, the tailgate motion is stopped in an irregular manner before reaching the closed position by the obstacle, which is invisible to the distance sensor 9 in this case. As a result, the distance between the distance sensor 9 and the grounded vehicle frame 7 and the capacitance C which is correlated with it are constant over time. The corresponding profile of the capacitance C is depicted in FIG. 3 as a capacitance profile $C_i(t)$. The capacitance profile $C_i(t)$ therefore has a time dependence which is significantly weaker compared to the reference profile $C_R(t)$. This time dependence is detected by the control unit 8 in the indirect anti-trap protection test 24 in that the measured capacitance profile $C_i(t)$ exceeds the reference profile $C_R(t)$ by a predefined threshold value $\Delta_S 2(t)$.

Specifically, within the scope of the direct anti-trap protection test 22, the control unit 8 continuously tests the condition $$C(t) < S_1(t) = C_R(t) - \Delta S_1(t). \quad \text{Equ. 1}$$

The time coordinate in the capacitance profile C(t) in particular describes the elapsed time interval since the start of the ongoing adjustment operation. The zero point of the time coordinate of the reference profile $C_R(t)$ is calibrated taking into consideration the starting position of the tailgate 2 at the beginning of the adjustment operation, so that corresponding values in the capacitance profile C(t) and the reference profile $C_R(t)$ are always compared, even for adjustment operations starting from different positions. The threshold value $\Delta S_1(t)$ is predefined as a function of time. Alternatively, this may, however, also be predefined as constant over time.

If the capacitance profile C(t) falls below the reference profile $C_R(t)$ by the threshold value $\Delta S_1(t)$ (as depicted in FIG. 3 by way of example based on the value of the capacitance profile $C_d(t)$ at time $t_1$), the stop signal H is output to the adjustment unit 5 by the triggering unit 26 (see FIG. 2).

In parallel with the direct anti-trap protection test 22, in an indirect anti-trap protection test 24 (see FIG. 2), the control unit 8 tests the condition $$C(t) > S_2(t) = C_R(t) + \Delta S_2(t). \quad \text{Equ. 2}$$

If the capacitance profile C(t) exceeds the reference profile $C_R(t)$ by the threshold value $\Delta S_2(t)$ (as depicted in FIG. 3 based on the value of the capacitance profile $C_i(t)$ at time $t_2$), the stop signal H is also output to the adjustment unit 5 by the triggering unit 26 (see FIG. 2). The threshold value $\Delta S_2(t)$ is predefined as a function of time. Alternatively, this may, however, also be predefined as constant over time.

The control unit 8 thus uses the capacitance C as a test value for testing the direct as well as the indirect trapping situation. In an alternative embodiment of the control unit 8, instead of the capacitance profile C(t), its time derivative averaged over time may also be used.

The threshold values $\Delta S_1(t)$ and $\Delta S_2(t)$ are chosen in such a way with respect to the taught-in reference profile $C_R(t)$ that a typical fluctuation range of the capacitance profile C(t) around the reference profile $C_R(t)$ is taken into account during operation, so that an erroneous triggering of the trapping situation is prevented. For example, fluctuations may occur due to temperature-dependent smooth running or sluggishness of the adjustment mechanism or due to weather-dependent influences on the measurement behavior of the distance sensor 9.

The subject matter of the present invention is not limited to the exemplary embodiment described above. Rather, additional specific embodiments of the present invention may be derived from the above description by those skilled in the art.

The following is a summary list of reference numerals and the corresponding structure used in the above description of the invention:

1 Rear
2 Tailgate
3 Upper edge
4 Trunk opening
5 Adjustment unit
6 Lever arm
7 Vehicle frame
8 (Anti-trap protection) control unit
9 Distance sensor
10 Sensor line
11 Control line
14 Transmitting electrode
16 Receiving electrode
18 Measuring field
20 Closing direction
22 (Direct) anti-trap protection test
24 (Indirect) anti-trap protection test
26 Triggering unit
X Adjustment path
C Capacitance
$C_R$ Reference value
C(t) Capacitance profile
$C_R(t)$ Reference profile
$C_d(t)$ Capacitance profile
$C_i(t)$ Capacitance profile
$\Delta S_1(t)$ Threshold value
$\Delta S_2(t)$ Threshold value
H Stop signal
t Time
$t_1$ Point in time
$t_2$ Point in time

The invention claimed is:

1. An anti-trap protection method for an adjustable vehicle part, the method comprising the following steps, to be performed continuously during an adjustment of the vehicle part:
   acquiring a test value with the aid of a distance sensor;
   performing a direct anti-trap protection test based on the test value by ascertaining whether an obstacle is detectable in the adjustment path of the vehicle part and, if necessary, stopping or reversing the adjustment; and
   performing an indirect anti-trap protection test based on the same test value by ascertaining whether a motion of the vehicle part has slowed down in an irregular manner or has come to a standstill and, if necessary, stopping or reversing the adjustment.

2. The anti-trap protection method according to claim 1, which comprises:
   comparing the test value with a reference value;
   in the direct anti-trap protection test, stopping or reversing the adjustment if the test value has a time dependence that is significantly stronger than the reference value according to stored criteria; and
   in the indirect anti-trap protection test, stopping or reversing the adjustment if the test value has a time dependence which is significantly weaker than the reference value according to stored criteria.

3. The anti-trap protection method according to claim 2, wherein the reference value is defined to have a magnitude which decreases over time, and
   in the direct anti-trap protection test, stopping or reversing the adjustment if the test value falls below the reference value by at least a first threshold value; and
   in the indirect anti-trap protection test, stopping or reversing the adjustment if the test value exceeds the reference value by at least a second threshold value.

4. The anti-trap protection method according to claim 2, wherein the reference value is defined to have a magnitude which increases over time, and
   in the direct anti-trap protection test, stopping or reversing the adjustment if the test value exceeds the reference value by at least a first threshold value, and
   in the indirect anti-trap protection test, stopping or reversing the adjustment if the test value falls below the reference value by at least a second threshold value.

5. The anti-trap protection method according to claim 1, wherein the test value is defined to have a magnitude that correlates running in the same direction or in the opposite direction to a distance between the adjustable vehicle part and an object nearest to the vehicle part in the adjustment direction.

6. The anti-trap protection method according to claim 1, wherein the test value is defined to have a magnitude that correlates running in the same direction or in the opposite direction to a temporal change in a distance between the adjustable vehicle part and an object nearest to the vehicle part in the adjustment direction.

7. An anti-trap protection device for an adjustable vehicle part, comprising:
   a distance sensor;
   an anti-trap protection-control unit being configured to automatically and continuously acquire a test value from said distance sensor during an adjustment of the adjustable vehicle part;
   said anti-trap protection-control unit being configured to perform a direct anti-trap protection test to stop or reverse the adjustment of said vehicle part upon detecting an obstacle in the adjustment path based on the acquired test value; and
   said anti-trap protection-control unit being configured to perform an indirect anti-trap protection test to stop or reverse the adjustment of said vehicle part by ascertaining if a motion of the vehicle part has slowed down in an irregular manner or has come to a standstill based on the acquired test value.

8. The anti-trap protection device according to claim 7, wherein the distance sensor is a capacitive proximity sensor.

* * * * *